(12) United States Patent
Johnson

(10) Patent No.: US 6,208,181 B1
(45) Date of Patent: Mar. 27, 2001

(54) SELF-COMPENSATING PHASE DETECTOR

(75) Inventor: Luke A. Johnson, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/006,650

(22) Filed: Jan. 14, 1998

(51) Int. Cl.$^7$ ............................................. H03L 7/06
(52) U.S. Cl. ........................ 327/156; 327/158; 327/163; 375/375; 375/376; 331/12; 331/25
(58) Field of Search ........................... 327/3, 5, 7, 8, 327/155, 156, 158, 163, 277; 375/373, 375, 376; 331/1 R, 10, 11, 12, 25

(56) References Cited

U.S. PATENT DOCUMENTS

| | | | | |
|---|---|---|---|---|
| 4,527,276 | * | 7/1985 | Gutlber | 375/23 |
| 4,628,260 | * | 12/1986 | Kimoto | 324/220 |
| 4,633,883 | * | 1/1987 | Matsui | 128/660 |
| 4,638,503 | * | 1/1987 | Wright | 381/16 |
| 4,642,573 | * | 2/1987 | Noda | 329/50 |
| 4,702,112 | * | 10/1987 | Lawrie | 73/629 |
| 4,959,617 | * | 9/1990 | Martin | 328/133 |
| 5,051,702 | * | 9/1991 | Iwasaki | 327/156 |
| 5,339,259 | * | 8/1994 | Puma et al. | 364/559 |
| 5,523,798 | * | 6/1996 | Hagino | 348/665 |
| 5,596,323 | * | 1/1997 | Erhage | 341/155 |
| 5,907,253 | * | 5/1999 | Davis et al. | 327/156 |
| 5,917,352 | * | 6/1999 | Dunlap et al. | 327/158 |

\* cited by examiner

Primary Examiner—Terry D. Cunningham
(74) Attorney, Agent, or Firm—Blakely, Sokoloff, Taylor & Zafman LLP

(57) ABSTRACT

A self compensating phase detector. Using two identical phase detectors introducing one of the phase detectors and a controlled variable phase shifter in a negative feedback loop shifts one dock signal enough such that the shifted signal compensates for existing static phase error. This self-compensation improves the accuracy of the phase difference measurement by significantly reducing the effect of static phase error. Moreover, this reduction remains true in spite of variations in process, temperature and voltage. Thus, inherent immunity of the invention to environmental conditions results in fewer failing parts during fabrication. Additionally, because the design is self-adjusting to environmental changes, design ease is significantly improved.

15 Claims, 3 Drawing Sheets

SELF-COMPENSATING PHASE DETECTOR

BACKGROUND OF THE INVENTION

1. Field of the Invention

The invention relates to clock signaling. More specifically, the invention relates to synchronization of an internal clock signal with a reference clock signal.

2. Related Art

The goal of a phase lock loop (PLL) is to synchronize otherwise asynchronous clock signals. To accomplish this synchronization, the PLL uses a phase detector which compares the phase of the two clocks that are to be synchronized and indicates the distance from synchronization. Ideally, if both clock signals are synchronized the output of this phase detector is zero. If the first signal is too fast the output is positive and if the first signal is too slow the output is negative. In reality due to physical limitations in design such as path mismatch and/or device mismatches a static phase error usually exists. This means that the phase detector will output zero when a static phase difference exists.

FIG. 1 is block diagram of a prior art phase lock loop. A reference clock signal (REF_CLK) 1 is input to phase detector 10. A second input of phase detector 10 is a clock signal (CLK) 2 generated from voltage controlled oscillator 12. Phase detector 10 compares the phase of the REF_CLK 1 to the phase of CLK 2. The result of the comparison is filtered by filter 11. The output of the filter drives the voltage controlled oscillator (VCO) 12 possibly through an amplifier (not shown) to generate the CLK 2. When the above discussed static phase error exists, the CLK 2 generated by VCO 12 will not be exactly synchronized with the REF_CLK 1. This results in non-ideal timing constraints in PLL applications and poor Bit Error Rates (BERs) in clock recovery circuit (CRC) applications.

The problem of static error is exacerbated as the frequency of REF_CLK increases. For a REF_CLK at two gigahertz 0.5 nanosecond period), even slight variations in delay through critical circuits can result in extreme deviations from the ideal sampling point. For example, a 63 pico second delay is equal to a 45° phase error at two gigahertz. In a data transfer system where a stream of random data is to be synchronized with a dock used to sample the data, the phase lock loop must lock the VCO dock signal to within a 10° phase difference to minimize the effect of phase difference on the BER. Prior art phase detectors cannot deliver this performance reliably under the variations in environment the phase detector is likely to encounter in actual use.

In view of the foregoing, it would be desirable to have a method and apparatus that reliably matches the phase of a reference dock to a second clock signal even at very high clock rates.

BRIEF SUMMARY OF THE INVENTION

An apparatus for compensating for phase error is disclosed. A first phase detector is replicated such that a first and second phase detector exist. A phase shifter is coupled in a feedback loop of the second phase detector. The output of the phase shifter is coupled to an input of each of the first and the second phase detectors.

DETAILED DESCRIPTION OF THE INVENTION

The embodiments of the invention described below improve the accuracy of the phase difference measurement by significantly reducing the effect of static phase error. Moreover, this reduction remains true in spite of variations in process, temperature and voltage. Thus, inherent immunity of the invention to environmental conditions results in fewer failing parts during fabrication. Additionally, because the design is self-adjusting to environmental changes, design ease is significantly improved. For example, in the prior art merely changing the load of the VCO output would change the slew rates and affect the performance of the phase detector. When the disclosed device is used the phase detector will self calibrate to the new conditions so that changes can be made without redesign. For example, using two identical phase detectors if the phase detectors are carefully drawn, introduction of one of the phase detectors and a voltage controlled phase shifter in a negative feedback loop shifts the signal enough such that the shifted signal compensates for existing static phase error. This same shifted signal is used for comparison by the first phase detector thereby reducing the effect of static phase error on the system's ability to lock to the reference clock signal.

Figure 1:
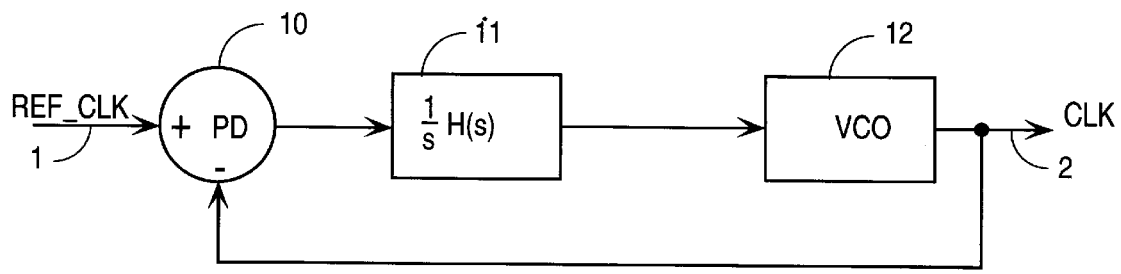
FIG. 1 is block diagram of a prior art phase lock loop.
Figure 2:
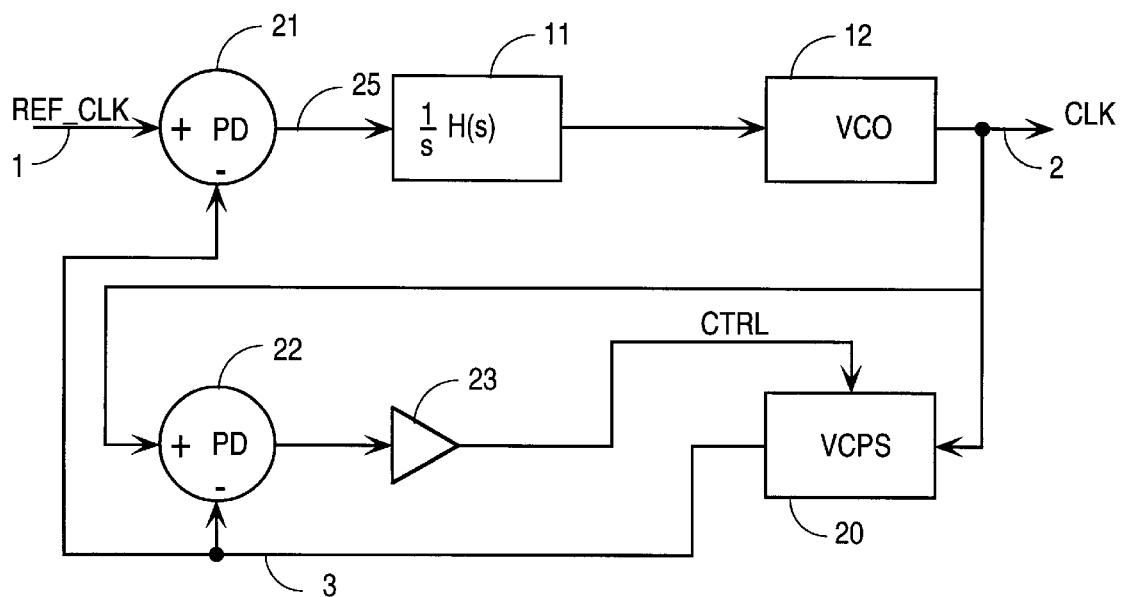
FIG. 2 is a block diagram of a phase lock loop employing one embodiment of the invention.

FIG. 2 is a block diagram of a phase lock loop employing one embodiment of the invention. A reference dock 1 (REF_CLK) is input to a phase detector 21. A voltage controlled oscillator 12 generates a local clock signal (CLK) 2. CLK 2 is simultaneously input into a second phase detector 22 and the voltage controlled phase shifter (VCPS) 20. Equivalently, a current controlled phase shifter (CCPS) could be used. Phase detector 22 is a replicate of phase detector 21. The output of the VCPS 20 is a second input to both phase detector 21 and phase detector 22. Accordingly, phase detector 22 effectively compares the CLK 2 with a phase shift of CLK (ΔCLK) 3. In an ideal world if in the initial instance the amount of phase shift caused by voltage VCPS 20 is zero the output of phase detector 22 should also be zero. However, if a static phase error exists, some phase shift must be introduced by VCPS 20 to drive the output of phase detector 22 to zero. An amplifier 23 amplifies the output of phase detector 22 so that small differences between CLK 2 and the ΔCLK 3 result in large control voltages driven into VCPS 20. Thus, ΔCLK 3 will be shifted until it drives the output of phase detector 22 to zero. The amount of phase shift in ΔCLK 3 should be just enough to accommodate the static phase error of the feedback loop. Because phase detector 22 and phase detector 21 are precise replicates of each other it is expected that the same static phase error will be present in both phase detectors. Thus, ΔCLK 3 applied to a second input of phase detector 21 for comparison with REF_CLK 1 will yield zero as the corrected phase difference 25 when CLK 2 is synchronized with the REF_CLK 1. In the shown embodiment, the corrected phase difference 25 drives a filter 11 which in turn drives the voltage controlled oscillator 12. Several suitable filters exist.

Figure 3:
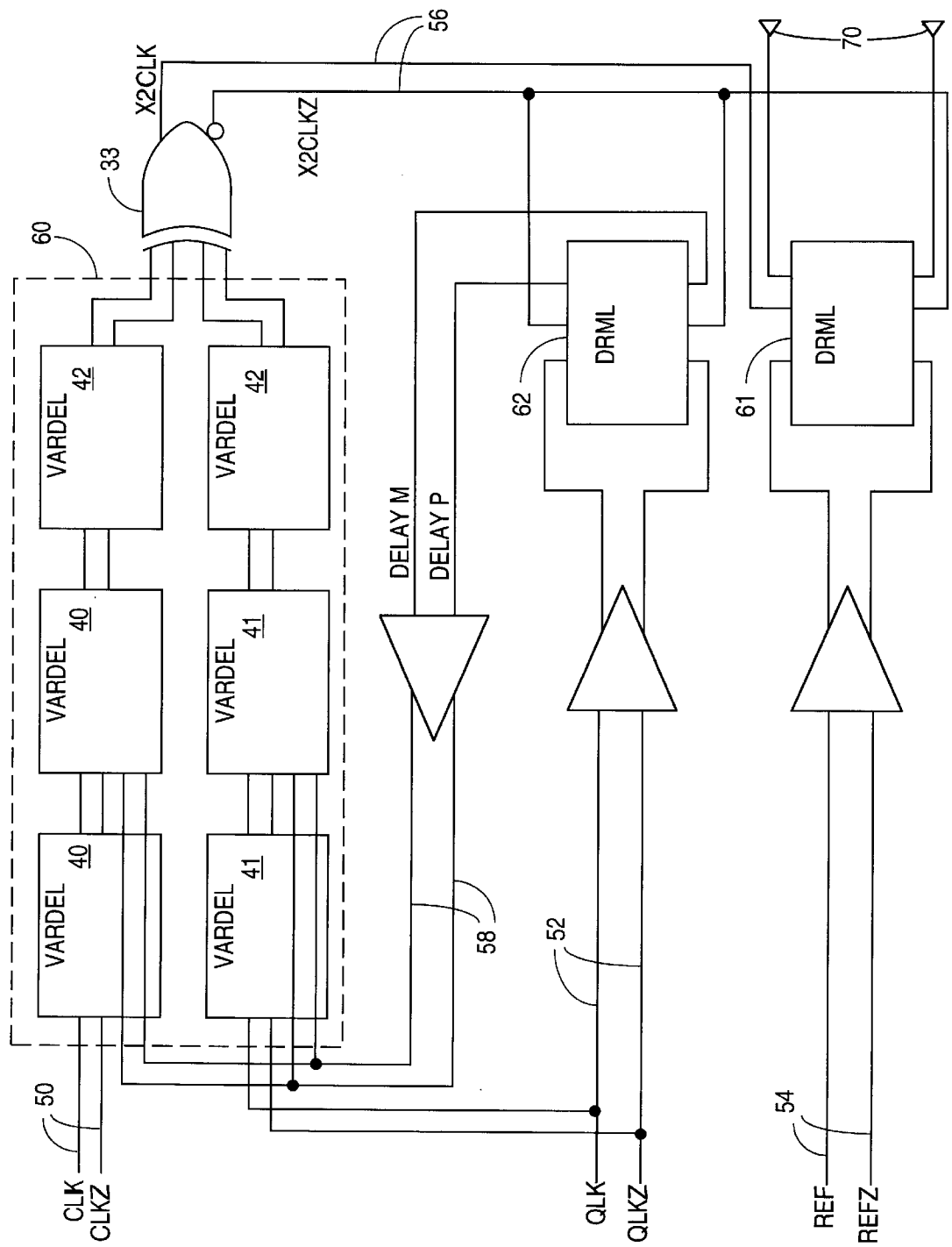
FIG. 3 is a block diagram of a differential clock recovery circuit employing another embodiment of the invention

FIG. 3 is a block diagram of a differential clock recovery circuit employing another embodiment of the invention. The differential input clock signals 50 comprising CLK and CLKZ and its quadrature dock signal 52 comprising QLK and QLKZ, are inputs to the voltage control phase shifter 60. Voltage control phase shifter 60 comprises 6 variable delay cells (VARDELs) 40, 41, 42. Some suitable VARDELs are described in co-pending application entitled A Variable Delay Cell With A Self-Biasing Load, Ser. No. 09/006,649 VARDELs 40 provide a variable delay of the differential input dock signals 50, while VARDELs 41 correspondingly delay the quadrature dock signals 52. VARDELs 42 merely serve as a layer of buffering between VARDELs 40 and 41 and exclusive-OR gate 33. Thus, using this implementation the input clock 50 and in the quadrature clock 52 can each have half the fundamental frequency of the differential output clock 56. Exclusive-OR gate 33 serves to double the frequency since an exdusive-OR of a clock signal and its quadrature necessarily cause a frequency doubling at the output. Thus, output clock 56 comprising 2×CLK and 2×CLKZ is at the fundamental frequency which is twice the frequency of both the input dock 50 and the quadrature dock 52.

Two differentiator rectifier mixer lowpass filter units (DRML) 61, 62 are coupled to the output clock 56 and respectively the reference dock 54, and the quadrature clock 52. The DMRL may be such as that described in co-pending application entitled Improved Differentiator, Rectifier, Mixer and Low-pass Filter Circuit, Ser. No. 08/940,456 assigned to the assignee of the present application. The phase detector is implemented with the mixer portion of the DRML. The differentiator and rectifier portions effectively double the quadrature dock signal 52 which is then compared to output dock 56 to generate the differential delay signal 58 delay and delay. Delay and delay are the control inputs for the VARDELs 40 and 41 as discussed above. Notably, while the exdusive-OR gate 33 would normally add additional static phase error to the clock, because it is part of the feedback loop the phase shifter will accommodate for any static phase error due to the exclusive OR gate 33. Ultimately, differential output 70 will be driven to zero when the reference clock is locked with the quadrature clock. Assuming the reference clock is clocking in a data stream, this is desirable because then sampling of the data should occur in the middle of the period during which the data is valid.

It has been found that the above described embodiment can take a two gigabit/second stream of random data and generate a synchronized clock to be used to sample the data. The lock obtained optimizes the BER by minimizing the effect of static phase error. Additionally, the embodiment can be successfully fabricated on a 0.4$\mu$ CMOS process.

Figure 4:
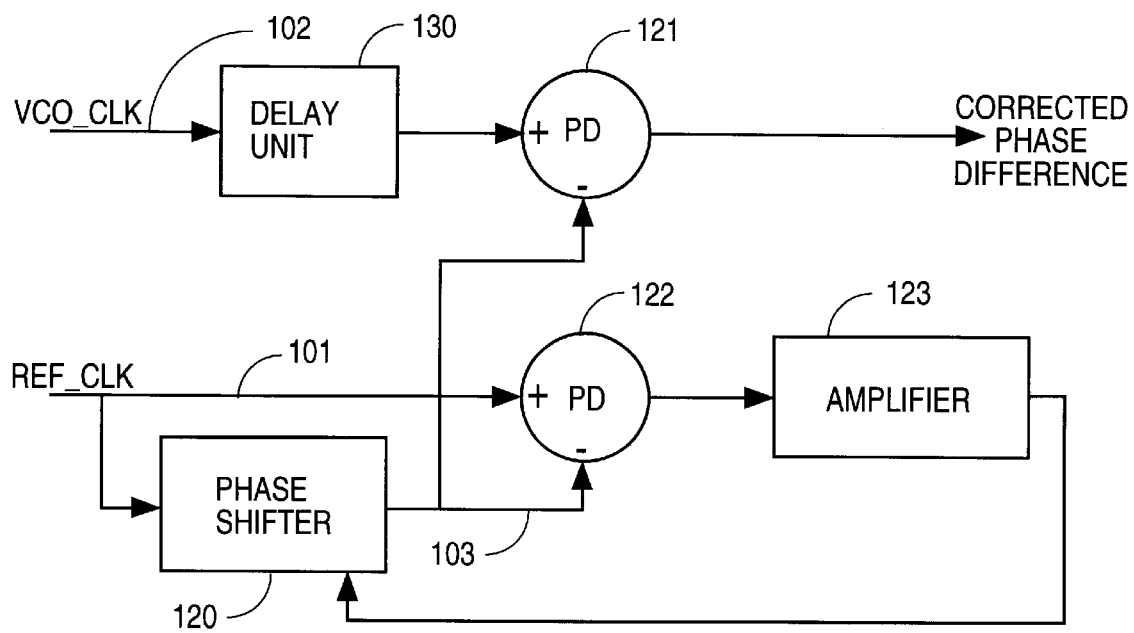
FIG. 4 is a block diagram of an alternative embodiment of the invention.

FIG. 4 is a block diagram of an alternative embodiment of the invention. In this embodiment, the reference dock is driven through a variable phase shifter 120 and phase detector 122. The shifted reference clock 103 is then applied to the other input of phase detector 122 as well as an input of phase detector 121. The result of the comparison in phase detector 122 is amplified by amplifier 123 and drives the phase shifter 120 thereby accommodating any static phase error existing in the design. The VCO clock is driven through a delay unit 130 into phase detector 121, the output of phase detector 121 is therefore the corrected phase difference between the reference dock and the VCO dock. Delay unit 130 could be implemented using a variable phase shifter with its inputs tied off. The purpose of delay unit 130 is to ensure that the clock path with the feedback loop is the fastest dock path. This is desirable because it is very difficult to add negative delay. Thus, by introducing a delay unit one can ensure that the VCO dock path (in this case) is never faster than the reference clock path.

It should be recognized by one of ordinary skill in the art that it is possible to accommodate the static phase error by introduction of the phase shifter and second phase detector into either clock path. It should also be understood by one of ordinary skill in the art that it is desirable to match as closely as possible the first and second phase detector of any of the embodiments. Thus, in drawing the phase detectors it is desirable to use greater than the minimum geometry so as to mitigate the risk of device mismatch between the two phase detectors. Moreover, while this particular device is useful for phase lock loops (PLL's) which are ubiquitous in the electronics industry, this would be it applicable to any system in which an accurate phase comparison (typically to achieve an accurate phase lock) is required.

Figure 5:
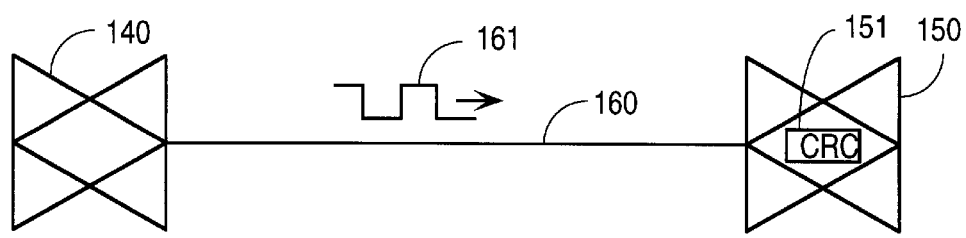
FIG. 5 is a diagram of a system employing one embodiment of the invention.

FIG. 5 is a diagram of a system employing one embodiment of the invention. A first transceiver 140 transmits signals over a serial bus 160 to a second transceiver 150. First transceiver transmits using a clock signal 161 which has a frequency and phase. A clock recovery circuit 151 in the second transceiver 150 matches the internal clock of transceiver 150 with the frequency and phase of the clock signal 151 coming over the serial bus 160. The embodiments shown in FIGS. 2–4 are suitable for use in CRC 151. In one embodiment the serial bus 160 follows the protocol described in IEEE Standard 1394-1995, IEEE Standard for a High Performance Serial Bus or a subsequent generation of that protocol such as described in 1394a Draft Standard for a High Performance Serial Bus (Supplement) or 1394b Draft Standard for a High Performance Serial Bus (Supplement). Revision to these Standards can be expected from time to time.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:
    a first phase detector;
    a second phase detector that is a replica of the first phase detector;
    a phase shifter coupled in a feedback loop of the second phase detector, wherein the phase shifter output is coupled to an input of each of the first and second phase detectors, wherein the second phase detector receives a clock signal and a phase shift of the clock signal, shifted by the phase shifter, an amount of phase shift determined by a comparison between the clock signal and the phase shift of the clock signal; and
    an amplifier coupled between the output of the second phase detector and the phase shifter.

2. The apparatus of claim 1 wherein the phase shifter comprises a plurality of variable delay units.

3. The apparatus of claim 2 wherein a first subset of the plurality of variable delay units shifts a clock signal and a second subset of variable delay units shifts a quadrature clock signal.

4. The apparatus of claim 3 further comprising:
    an exclusive OR gate having as inputs a shift of the clock signal and a shift of the quadrature clock signal thereby generating a double speed clock signal.

5. The apparatus of claim 1 wherein the clock signal is a differential signal.

6. A method comprising the steps of:

comparing, in a first phase detector, a first clock signal and a phase shifted first clock signal;

adjusting phase shift of the first clock signal based on a result of a comparison of the first clock signal and the phase shifted first clock signal; and comparing in a second phase detector that is a replica of the first phase detector, the phase shifted first clock signal with a second clock signal.

7. The method of claim 6 further comprising:

amplifying an output of the first phase detector to drive the phase shift.

8. The method of claim 6 further comprising:

introducing a delay into a signal path of the second clock signal to insure that a signal path of the first clock signal is always equal or shorter than the signal path of the second clock signal.

9. The method of claim 6 wherein at a time t=0 the phase shift is equal to 0.

10. The method of claim 6 wherein the first phase detector and second phase detector are drawn using greater than minimum geometries.

11. A system comprising:

a serial bus for transferring data responsive to a first clock signal; and a transceiver coupled to the serial bus, the transceiver responsive to a second clock signal, the transceiver including a first phase detector, a second phase detector and a phase shifter, the first phase detector and the phase shifter coupled in a negative feedback loop to shift one of the first clock signal and the second clock signal to compensate for a static phase error based on a comparison between the shifted signal and the signal before shifting wherein an amount of the shift by the phase shifter is determined from the comparison.

12. The system of claim 11 wherein the clock signal shifted is the clock signal having a fastest signal path.

13. The system of claim 11 wherein the first clock signal is a voltage controlled oscillator (VCO) clock signal and the second clock signal is an external reference clock signal.

14. The system of claim 13 wherein the reference clock signal is at a clock rate of incoming data.

15. The system of claim 14 wherein the reference clock signal is compared to a shifted VCO clock signal by the second phase detector and the VCO clock signal and the shifted VCO clock signal are compared by the first phase detector.

* * * * *

UNITED STATES PATENT AND TRADEMARK OFFICE
CERTIFICATE OF CORRECTION

PATENT NO. : 6,208,181 B1
DATED : March 27, 2001
INVENTOR(S) : Johnson

It is certified that error appears in the above-identified patent and that said Letters Patent is hereby corrected as shown below:

Title page,
Item [57], ABSTRACT, line 4, delete "dock" and insert -- clock --.

Column 1,
Line 43, delete "dock" and insert -- clock --.
Line 44, delete "dock" and insert -- clock --.
Line 53, delete "dock" and insert -- clock --.

Column 2,
Line 34, delete "dock" and insert -- clock --.

Column 3,
Line 1, delete "dock" and insert -- clock --.
Line 8, delete "dock" and insert -- clock --.
Line 9, delete "dock" and insert -- clock --.
Line 15, delete "exdusive-OR" and insert -- exclusive-OR --.
Line 17, delete "2xCLK" and insert -- X2CLK --.
Line 18, delete "2xCLK" and insert -- X2CLK --.
Line 19, delete "dock 50" and insert -- clock 50 --.
Lines 19-20, delete "dock 52" and insert -- clock 52 --.
Line 23, delete "dock 54" and insert -- clock 54 --.
Line 30, delete "dock" and insert -- clock --.
Line 31, delete "dock 56" and insert -- clock 56 --.
Lines 31-32, delete "delay signal 58 delay and delay. Delay and delay are" and insert -- delay signal 58 delayp and delaym. Delayp and delaym are --.
Line 33, delete "exdusive-OR gate 33" and insert -- exclusive-OR gate 33 --.
Line 36, delete "exclusive OR gate 33" and insert -- exclusive-OR gate 33 --.
Line 50, delete "dock" and insert -- clock --.

Signed and Sealed this

Twenty-first Day of May, 2002

*Attest:*

*Attesting Officer*

JAMES E. ROGAN
*Director of the United States Patent and Trademark Office*